United States Patent
Komeno et al.

(10) Patent No.: US 6,837,940 B2
(45) Date of Patent: Jan. 4, 2005

(54) FILM-FORMING DEVICE WITH A SUBSTRATE ROTATING MECHANISM

(75) Inventors: Junji Komeno, Tokyo (JP); Kazushige Shiina, Tokyo (JP)

(73) Assignee: E.E. Technologies Inc., Tokyo (JP)

( * ) Notice: Subject to any disclaimer, the term of this patent is extended or adjusted under 35 U.S.C. 154(b) by 0 days.

(21) Appl. No.: 10/002,177

(22) Filed: Dec. 5, 2001

(65) Prior Publication Data

US 2002/0083899 A1 Jul. 4, 2002

(30) Foreign Application Priority Data

Dec. 7, 2000 (JP) ........................................ 2000-373278

(51) Int. Cl.[7] ..................... H01L 21/205; H01L 21/285; C23C 16/00
(52) U.S. Cl. .............. 118/730; 156/345.55; 204/298.27
(58) Field of Search ................................ 118/730, 500, 118/723, 715, 1; 156/345.55; 204/298.27, 298.12; H01L 21/205

(56) References Cited

U.S. PATENT DOCUMENTS 3,783,822 A * 1/1974 Wollam ...................... 118/725
5,343,938 A * 9/1994 Schmidt ...................... 165/80.2

FOREIGN PATENT DOCUMENTS

| JP | 03069119 A | * | 3/1991 | ......... H01L/21/302 |
| JP | 03171616 A | * | 7/1991 | ......... H01L/21/205 |

* cited by examiner

Primary Examiner—Gregory Mills
Assistant Examiner—Ram N Kackar
(74) Attorney, Agent, or Firm—Sughrue Mion, PLLC (57) ABSTRACT

A film-forming device with a substrate rotating mechanism includes a susceptor 30 in the form of a circular disk; a base plate 6 positioned below the susceptor 30 and rotatably retaining the susceptor 30; a revolution generating section 5 rotating the susceptor 30 at the outer periphery of the susceptor 30; a plurality of substrate tray retaining sections 23 arranged on the susceptor 30; a plurality of annular substrate trays 20 rotatably supported in the corresponding substrate tray retaining sections 23; a rotation generating section 4 rotating the substrate trays 20; and a plurality of substrates W retained in the substrate trays 20. The substrates W are revolved by the rotation of the susceptor 30 and rotated by the rotation of the substrate trays 20 to apply a certain film-forming process. The substrates W are rotated and revolved by one or more revolution generating section 5 and the rotation generating section 4.

14 Claims, 6 Drawing Sheets

FILM-FORMING DEVICE WITH A SUBSTRATE ROTATING MECHANISM

FIELD OF THE INVENTION

The present invention relates to a film-forming device with a substrate rotating mechanism, wherein a certain film-forming process is applied on substrates while rotating the substrates. More particularly, the present invention relates to a film-forming device with a substrate rotating mechanism, wherein a film-forming process is applied while rotating (revolving) a susceptor, which retains a plurality of substrates, by the substrate rotating mechanism and simultaneously rotating the substrates. Hereinafter, the wording "revolve" refers to a turning movement of each substrate around the axis of the susceptor which retains the substrates, and the wording "rotate" refers to a rotation of each substrate on the susceptor around its own axis.

<Characteristics>

The film-forming device with a substrate rotating mechanism according to the present invention forms a desired temperature distribution within a certain processing region upon processing a certain chemical or physical scientific film-forming operation on the substrates, and also uniformly and effectively forms a desired surface by rotating and revolving a plurality of substrates. The film-forming device particularly achieves a great deal of effects on a thin-film formation, such as by Metal Organic Chemical Vapor Deposition (hereinafter referred to as "MOCVD") that is subject to temperature distribution.

BACKGROUND OF THE INVENTION

In the field of semiconductor devices, there has recently been an increased demand for film-formation processing technology to form a desired surface. Especially, MOCVD technique has been focused as a film-formation processing technique to form a thin-film for compound semiconductors that are useful to an optical device and a high-speed electronic device. In the film-forming device used for MOCVD technique and equipped with a substrate rotating mechanism, a thin-film forming technique is particularly important to form a desired uniform thin-film obtained by the result of a certain chemical reaction made by the introduction of a reactive raw gas over the substrate surface.

When a desired thin-film is formed by the MOCVD technique, it is known that the surf ace reaction produced on the substrate surface by the reactive raw gas is extremely complicated. In other words, because a lot of parameters including temperatures of the substrate and the raw gas, flow velocity, pressure, active chemical species contained in the raw gas, components of the residual gas in the reaction system and the like contribute to the surface reaction, it is very difficult to control these parameters in the MOCVD technique to form a desired thin-film.

In this circumstance, various techniques have been proposed with respect to the film-forming device utilizing MOCVD technique, wherein a desired thin-film is formed in a more uniform and stable manner over the substrate surface under a certain condition.

As a technique to form a thin-film due to equalizing the thickness and the composition of the film, a method for rotating substrates in a horizontal plane has been adapted.

For example. Journal of Crystal Growth 115 discloses that when forming an InGaAsP thin-film arranged on an InP substrate in a lattice-shaped manner, the pressure within the reaction tube of the MOCDV apparatus and the flow rate of the carrier gas are determined merely based on the characteristic that the boundary of the film is clearly defined, and equalizing the thickness and the composition of the film formed from the upstream to the downstream of the carrier gas flow is carried out by rotating the substrates in the horizontal plane.

In the substrate rotation technique, in order to improve the effects of the equalized film thickness and film compositions by the rotation of the substrates, a so-called rotation/revolution mechanism for the substrate has been used, wherein a susceptor retaining substrates is rotated in such a manner that the substrates revolve around the rotational axis of the susceptor.

Figure 5:
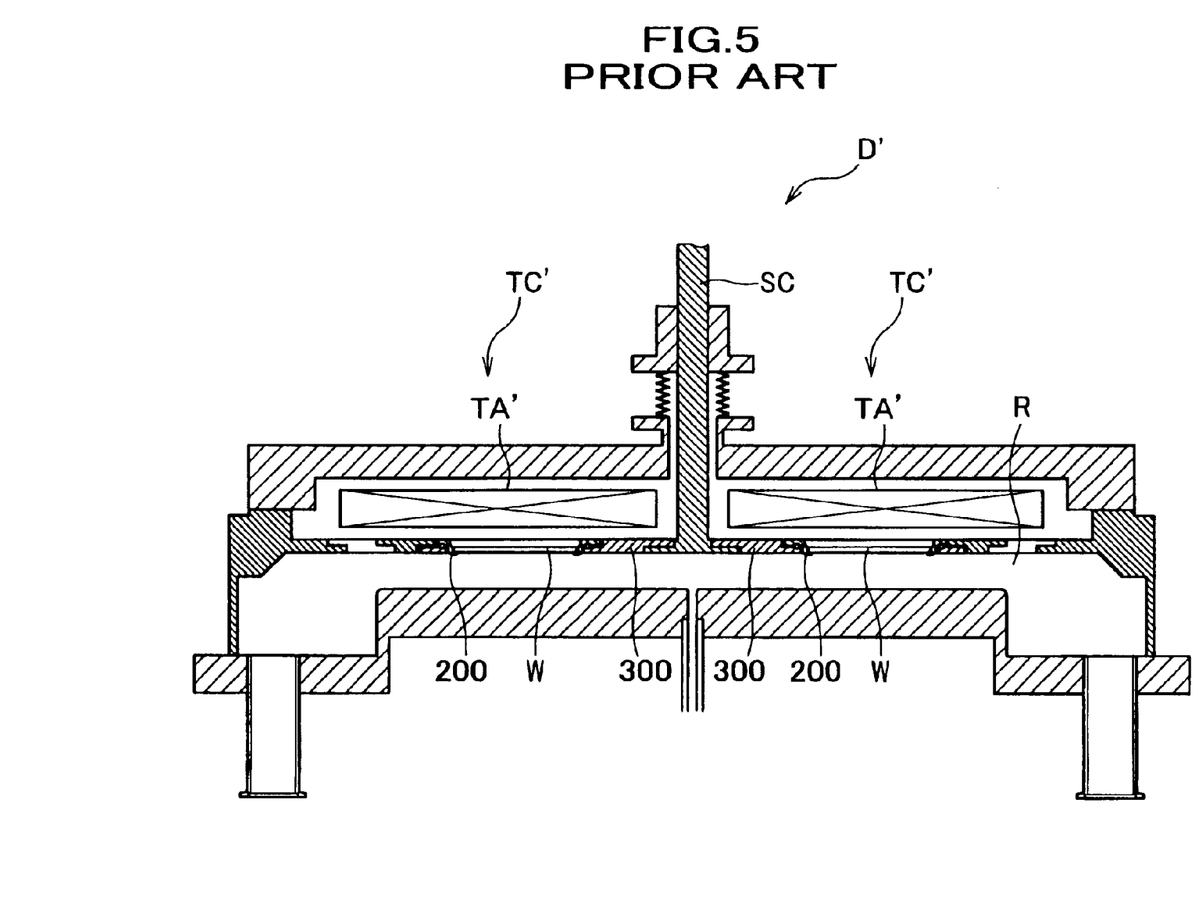
FIG. 5 is a sectional view schematically illustrating one example of a prior art film-forming device with a substrate rotating mechanism.

As best seen in FIG. 5, such a rotation/revolution mechanism generally comprises substrates W, substrate trays 200 for retaining substrates W, a susceptor 300 for retaining the substrate trays 200, a substrate rotation mechanism (not shown) for rotating the substrates W and a rotation shaft SC for rotating the susceptor 300.

For example, as one example of a prior art film-forming device with a substrate rotating mechanism, Japanese Patent Publication No. Hei-7-78276 discloses a rotating device which is equipped with a rotating susceptor utilizing for a vapor-phase epitaxy chamber. The rotating device is equipped with a flat susceptor, which rotates around a rotation shaft perpendicular to the reference plans in a manner parallel to the reference plane, a stabling means for stabling the susceptor to be supported floatingly and a rotating means for rotating the susceptor. Further, both of the stabling means and the rotating means are formed by the susceptor, the rotation shaft, and structures arranged at the reference plane, which cooperate to each other by the influence of one or more gas flow. In order to obtain a rotational movement of the susceptor to be supported floatingly by the viscous force, the rotating device for the vapor-phase epitaxy reactor chamber is constituted such that the structures at the reference plane are provided with a hole and spiral grooves for the insertion of a supplemental gas flow, and the gas flow supplied through the hole is flown into the grooves curving toward the direction to which the susceptor is rotated.

Japanese Laid-open Patent Publication No. Hei-10-116789 discloses a substrate rotating device, wherein substrates are rotated within the chamber which is constituted by walls forming a cavity. The substrate rotating device comprises a first rotating means arranged within the cavity and rotating the substrate around a first axis, a second rotating means arranged outside of the chamber and rotating a planetary gear around the first axis, a magnetically coupling means magnetically coupling the first rotating means and the second rotating means through the walls and harmonically rotating the first and second rotating means around the first axis, a sun gear arranged outside of the chamber and meshing with the planetary gear, and a first driving means carrying out a first rotation with respect to the first rotating means, the second rotating means and the substrate around the center axis and further simultaneously carrying out, by the meshing between the planetary gear and the sun gear, a second rotation with respect to the first rotating means, the second rotating means and the substrate around the first axis.

Japanese Laid-open Patent Publication No. 2000-91232 discloses a substrate heating and transporting process apparatus. The substrate heating and transporting process apparatus comprises a pressure-controllable common chamber, a transporting plate movable in the common chamber while retaining a vacuum state, one or more substrate heating section transported by the transporting plate, and one or more pressure-controllable processing chamber connected to the common chamber through the opening of the separation wall. The substrate heating section includes a heating means and a substrate tray which holds a substrate to be heated by the heating means. The substrate heating section abuts to the opening of the separation wall, while retaining a certain substrate temperatures with a downward movement thereof by the movement of the transporting plate so that the substrate heating section and the processing chamber are locked to form a vacuum-sealed chamber that is independently pressure-controlled by the substrate heating section and the processing chamber.

Further, Japanese Laid-open Patent Publication No. 2000-87237 discloses a coaxial-type vacuum heating apparatus. The vacuum heating apparatus comprises a pressure-controllable common chamber, a cylindrical revolutionary moving shaft carrying out rotational and vertical movements while retaining a vacuum state in the common chamber and connecting with electric wiring and water-cooling piping, both positioned outside of the common chamber, a transporting plate coaxially fixed to the rotating axis of the revolutionary moving shaft, one or more substrate heating section arranged at a position around the rotating axis of the transporting plate, and one or more pressure-controllable processing chamber connected to the common chamber through the opening of the separation wall in association with the substrate heating section, wherein the substrate heating section includes a heating means having water-cooling piping for the purpose of water cooling, and a substrate tray holding a substrate to be heated by the heating means.

However, these prior art substrate rotating mechanisms have the following drawbacks:

(1) Since the susceptor is rotated in such a manner that the rotation of the rotation driving section causes the rotation shaft, which is arranged at a position of the center axis of the susceptor provided with a substrate tray holding a substrate, to be rotated, the susceptor has to be highly accurately attached with respect to the rotation shaft. This leads to a difficulty in adapting large-sized substrates.

(2) These substrate rotating mechanisms have a relatively complicated construction because of the rotation shaft. Therefore, at a periodic inspection of the MOCVD apparatus having the aforementioned substrate rotating mechanism, removing the susceptor requires relatively complicated and time-consuming operations.

(3) As illustrated in FIG. 5, since the rotation shaft is normally provided at the center of the susceptor and also at the center of the reacting chamber, a temperature control mechanism is not positioned on the extension of the axis line extending through the center of the reacting chamber. For this reason, it is difficult to control the temperature around the center portion of the reacting chamber.

(4) At a periodic inspection of the MOCVD apparatus, fixing the susceptor to the original position after removing and cleaning the susceptor is relatively complicated and time-consuming, and precisely positioning the susceptor, especially detecting the horizontal plane is complicated. If a small error occurs in the proximity of the center of the susceptor during the positioning operation, a relatively large error occurs at the outer periphery of the susceptor.

(5) When the substrate rotating mechanism rotates the substrate by injecting a gas toward the reverse side of the substrate, a foreign object, such as a deposit caused by a part of reaction products, is subject to be whirled up at the substrate tray and its periphery by the injection of the gas, resulting in a deposit or adhesion of the foreign object at the reverse side and the front side of the substrate.

(6) In the substrate rotating mechanism in which a gas is injected toward the reverse side of the substrate, a film-forming process is carried out with the film-formation plane of the substrate positioned upward. In this event, a foreign object dropping from the above tends to deposit on the film-formation plane. Further, in such a substrate rotating mechanism wherein injection of the gas is carried out, it is difficult to check whether the substrate is rotated normally.

(7) In the film-forming processing device with such a substrate rotating mechanism, since the susceptor is formed from a continuous disk-shaped member, it is difficult to make a desired temperature profile on the susceptor by the temperature control mechanism during the film-forming process.

In view of the above, the purpose of the present invention is to provide a film-forming device with a substrate rotating mechanism, wherein with the provision of the rotation/revolution mechanism of the substrate, a precise adjustment of the rotation shaft of the susceptor is carried out with a simple manner, an excellent maintainability is achieved and further a deposit of the foreign object on the substrate is prevented, and wherein with making the temperatures of the susceptor and the periphery of the substrate to be a desired temperature profile, a desired film-forming process having a desired film property and a desired film thickness can be carried out.

SUMMARY OF THE INVENTION

With the foregoing drawbacks of the prior art in view. the applicants designed a rotation/revolution device used for a film-forming process apparatus carrying out the Metal Organic Chemical Vapor Deposition and the like, wherein in order to carry out a rotation and a revolution of the substrate simultaneously, the rotation (revolution) of a disk-shaped stage (susceptor) which retains a plurality of substrates is performed via a driving gear to thereby exclude the rotation shaft provided in conformity with the rotation axis of the susceptor, and wherein gear teeth are formed around the outer periphery of substrate trays each holding the substrate such that the gear teeth of each substrate tray mesh with a stationary gear fixedly arranged at an upper part of the outer periphery of the susceptor which accommodates the plurality of substrate trays and their gear teeth, so that the rotation (revolution) of the susceptor causes the substrate trays and therefore the substrates to rotate simultaneously. Further, the applicants created a device, which ensures a desired accuracy of the rotation/revolution mechanism for the substrates over more extended period of time, a simple manner of maintenance, and a desired temperature profile in the reaction system of the film-forming process, and thereby completed the present invention.

Figure 1:
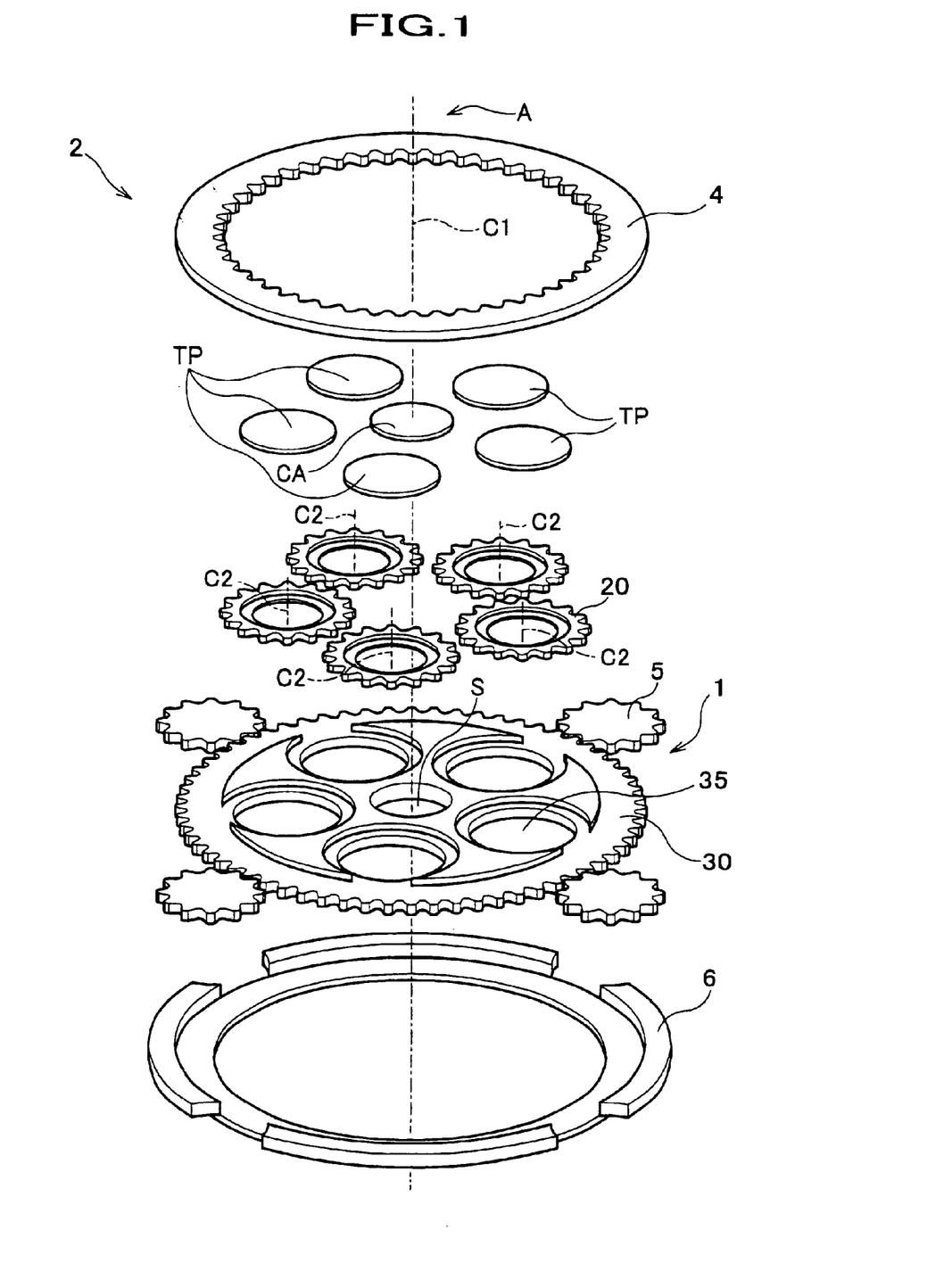
FIG. 1 is a broken perspective view illustrating a main structure of a rotation/revolution mechanism used for a film-forming device with a substrate rotating mechanism according to the present invention.

According to the present invention, there is provided a film-forming device with a substrate rotating mechanism, which comprises:

a susceptor 30 in the form of a circular disk and provided at the outer periphery with a revolution input section 31;

a base plate 6 positioned below the susceptor 30 and rotatably retaining the susceptor 30:

a first rotating mechanism including at least one revolution generating section 5, the revolution generating section 5 rotating the susceptor 30 at the outer periphery of the susceptor 30 by way of imparting a rotating force to the revolution input section 31;

a plurality of substrate tray retaining sections 23 positioned circumferentially around a rotation axis C1 of the susceptor 30;

a plurality of annular substrate trays 20 provided at the outer periphery with a rotation input section 21 and rotatable supported in the corresponding substrate tray retaining sections 23;

a second rotating mechanism including a rotation generating section 4, the rotation generating section 4 rotating the substrate trays 20 by way of imparting a rotating force to each rotation input section 21; and a plurality of substrates W retained in the corresponding substrate trays 20, the substrates W being revolved by the rotation of the susceptor 30 and rotated by the rotation of the substrate trays 20 to apply a certain film-forming process (see FIG. 1).

With such a constitution, when the susceptor 30 is rotated by at least one revolution generating section 5, the substrate trays 20 revolve around the rotation axis C1 of the susceptor 30, and when each substrate tray 20 is rotated by way of imparting a rotating force of the rotation generating section 4 to the rotation input section 21 provided at the outer periphery of the substrate tray 20, the substrate W placed on the substrate tray 20 is rotated. As a result, each substrate W Is rotated and revolved (see FIG. 1).

In the aforementioned film-forming device with a substrate rotating mechanism, the first rotating mechanism 1 may rotatably retain the susceptor 30 via a bearing B1 supported between bearing grooves 32, 62, each provided at the susceptor 30 and the base plate 6, and the second rotating mechanism 2 may rotatably retain the substrate trays 20 via a bearing B2 supported between bearing grooves 23, 33, each provided at the substrate trays 20 and the susceptor 30 (see FIG. 1).

With such a constitution, the first rotating mechanism 2 for rotatably retaining the susceptor 30 with respect to the base plate 6 and the second rotating mechanism 1 for rotatably retaining the substrate trays 20 with respect to the susceptor 30 are readily constituted (see FIG. 1).

In the first rotating mechanism 1 of the aforementioned film-forming device with a substrate rotating mechanism, the bearing groove 32 of the susceptor 30 and the bearing groove 62 of the base plate 6 may be each provided with a horizontal plane and a vertical plane. Also, the bearing groove 32 of the susceptor 30 may support the bearing B1 at an upper support portion 3a and an outer support portion 3b, which position above the bearing B1 and provided in the horizontal and vertical planes, and the bearing groove 62 of the base plate 6 may support the bearing B1 at a lower support portion 6a and an inner support portion 6b, which position below the bearing B1 and provided in the horizontal and vertical planes. And further, the upper support portion 3a and the lower support portion 6a may position at the uppermost position and the lowermost position of the bearing B1, and the outer support portion 3b and the inner support portion 6b may position at both ends of the bearing B1 in the horizontal direction (see FIGS. 2 and 3).

With such a constitution of the first rotating mechanism 1 having the bearing B1, when applying a certain film-forming process on the substrates W, even if the susceptor 30 and the base plate 6 are thermally expanded due to heating the internal area thereof, the bearing B1 is stably supported to rotate the susceptor 30 in a stable manner and hence to enable a revolution of each substrate W. This is because the upper support portion 3a and the lower support portion 6a are always kept at the uppermost position and the lowermost position, preventing the susceptor 30 from displacing vertically, and the inner support portion 6b and the outer support portion 6b always retains the susceptor 30 horizontally regardless of an expansion of the susceptor 30 toward the outer periphery (see FIGS. 1 to 3). Therefore, it is possible to provide a film-forming device with a substrate rotating mechanism, wherein a sphere B of the bearing is stably supported and a stable rotation of the susceptor 30 is ensured.

Figure 2:
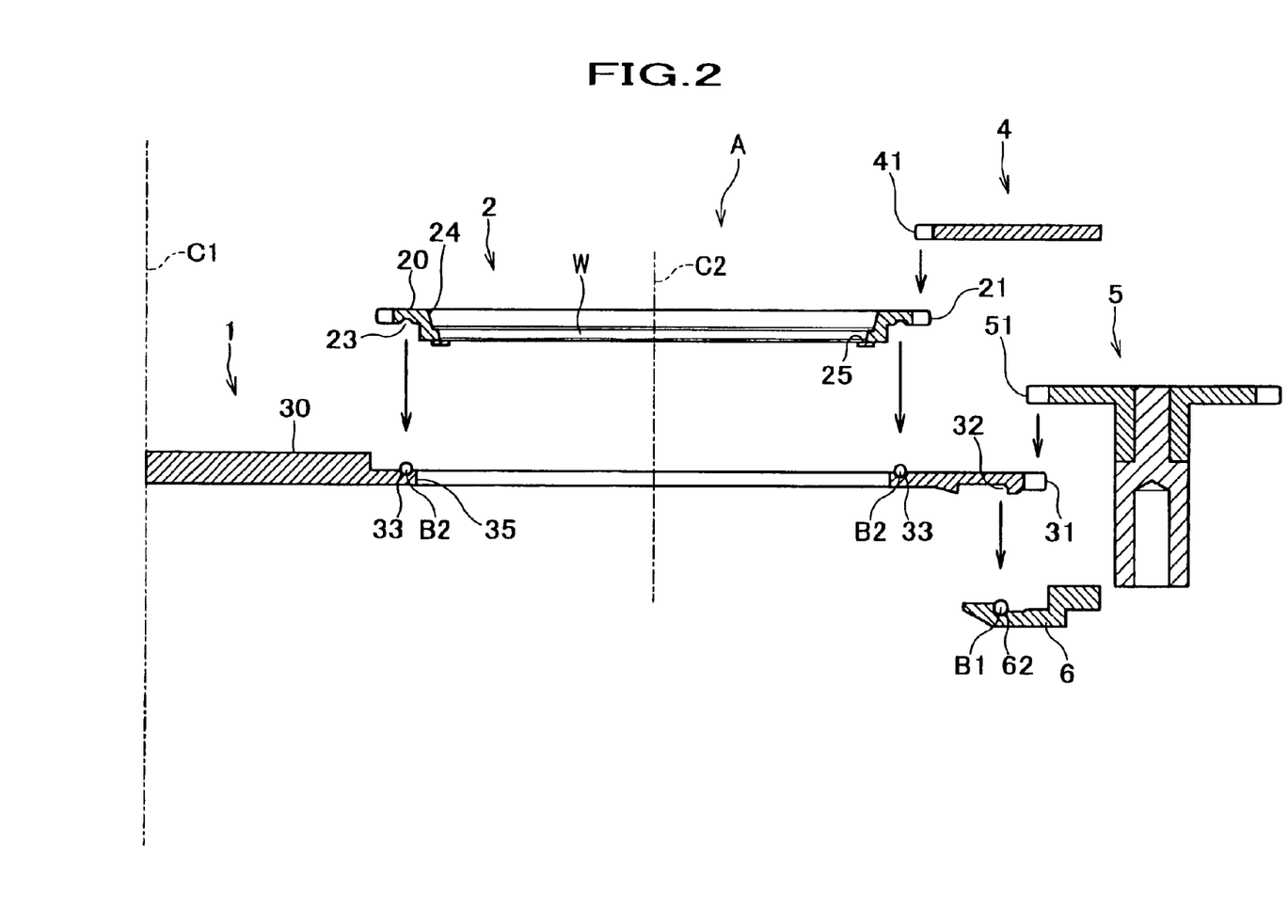
FIG. 2 is a sectional view schematically illustrating the structure of the rotation/revolution mechanism.

Further, in the aforementioned film-forming device with a substrate rotating mechanism, each substrate tray 20 may retain the substrate W on a substrate support 25 with a film-formation plane of the substrate W positioned downward (see FIG. 2).

With such a constitution, since the film-formation plane of the substrate W is positioned downward, it is possible to prevent a deposition or adhesion of a foreign object on the film-formation plane, to which a certain film-forming process is applied (see FIG. 2).

Further, the aforementioned film-forming device with a substrate rotating mechanism may comprises a temperature control mechanism TC for adjusting a certain area including the plurality of substrates W to a desired temperature distribution, and the temperature control mechanism TC may include at least two temperature control devices TA, which position both above and below the susceptor 30 or only above the susceptor 30 (see FIG. 4).

Figure 4:
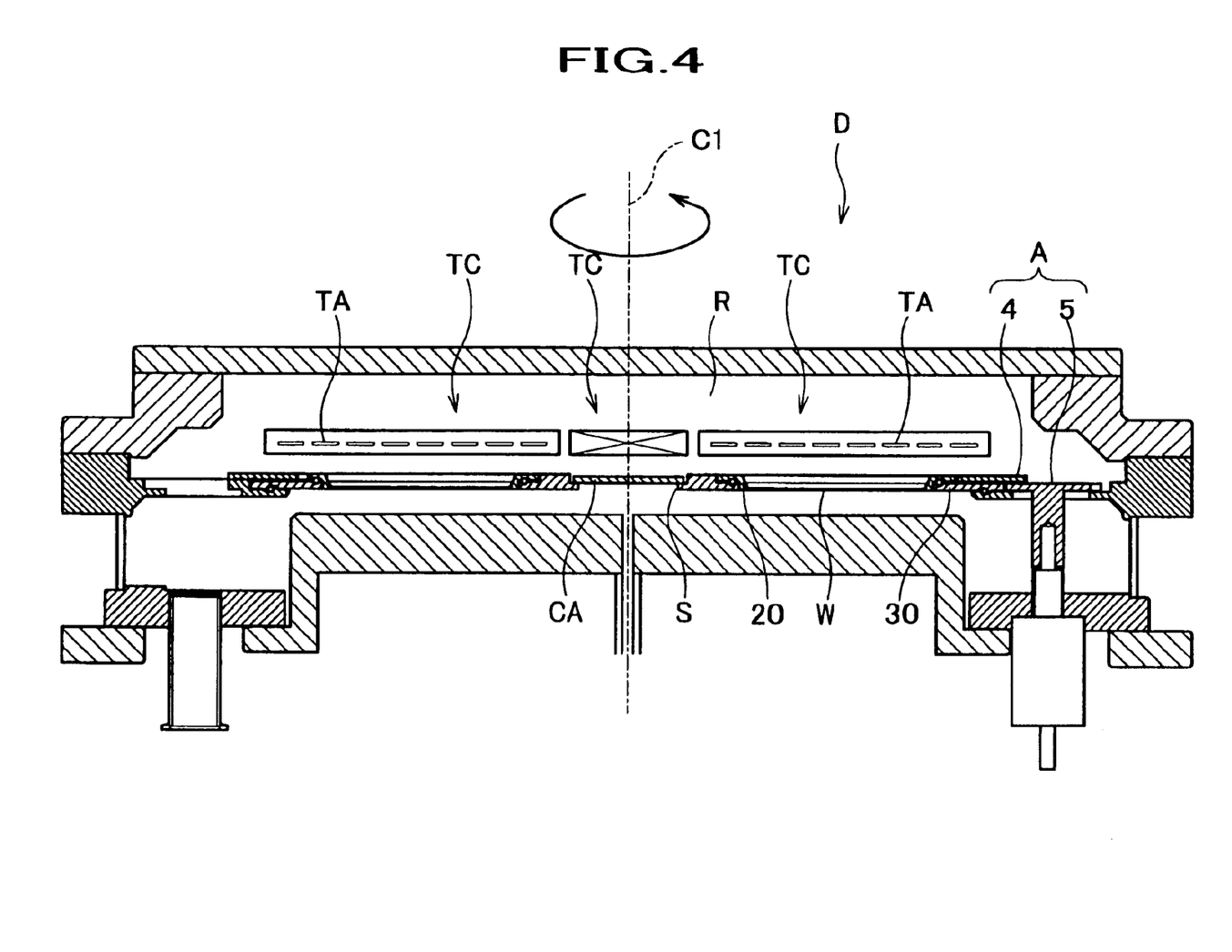
FIG. 4 is a sectional view schematically illustrating one example of a film-forming device with a substrate rotating mechanism according to the present invention.

With such a constitution, since the temperature control mechanism TC includes at least two temperature control devices TA and at least one temperature control device TA is arranged above the susceptor 30, it is possible to make a desired temperature profile on the susceptor 30 and the periphery of the substrate W (see FIG. 4). Therefore, it is possible to provide a film-forming device with a substrate rotating mechanism, wherein temperatures of the susceptor 30 and the peripheral portion of each substrate W is made to a desired temperature profile.

In the aforementioned film-forming device with a substrate rotating mechanism, the substrate trays 20, the susceptor 30 and the bearings B1, B2 may be made from graphite carbon (see FIG. 2).

With such a constitution, since the substrate trays 20, the susceptor 30 and the bearings B1, 32 are made from graphite carbon, each of the substrate tray 20, the susceptor 30 and the bearings B1, B2 improves its thermal conductivity and heat resistance and thus a desired temperature profile is readily made by the temperature control mechanism TC over the susceptor 30 and the periphery of each substrate W (see FIG. 2).

Further, in the aforementioned film-forming device with a substrate rotating mechanism, the susceptor 30 may be provided at a center portion with an opening S, and the opening S is covered by a cap member CA, which is made from the material selected from the group consisting of carbon (C), quartz ($SiO_2$), molybdenum (Mo), tungsten (W), silicon carbide (SiC), silicon (Si) and gallium arsenide (GaAs) (see FIGS. 1 and 4).

With such a constitution, since the cap member CA covers the opening S formed at the center portion of the susceptor 30, the thermal conductivity in the horizontal direction of the susceptor 30 is readily controlled. Accordingly, an appropriate temperature profile required for thin-film growth is readily obtained, such as by preventing a thin-film deposition on an unnecessary part within the reacting chamber by way of controlling the decomposing reaction of the raw gas, and by restricting the raw material cost with improving efficiency of raw gas utilization. The shape of the opening S may be of a symmetrical form around the rotation axis C1 (see FIGS. 1 and 4), and in accordance with a desired temperature profile to be described later, the shape may be polygonal, disk-shaped, star-shaped or cloud-shaped.

Moreover, the cap member CA is made from the material selected from the group consisting of carbon (C), quartz ($SiO_2$), molybdenum (Mo), tungsten (W), silicon carbide (SiC), silicon (Si) and gallium arsenide (GaAs), the following advantages are obtained, such as preventing an incorporation of impurities, which affects the thin-film characteristic (especially, semiconductor thin-film characteristic), and excellent heat resistance at a certain temperatures required for the thin-film growth while retaining the coefficient of thermal expansion appropriately low values. Further, in the case of $SiO_2$, Mo, W, SiC, Si and GaAs, since they are excellent in washability, the cap member CA can be repeatedly washed with an organic solvent. This leads to cleanliness of the cap member CA over a relatively long period of time, thereby extending the service life (see FIGS. 1 and 4).

Further, in the aforementioned film-forming device with a substrate rotating mechanism, the certain film-forming process may be a thin-film growth by Metal Organic Chemical Vapor Deposition (MOCVD).

Figure 6:
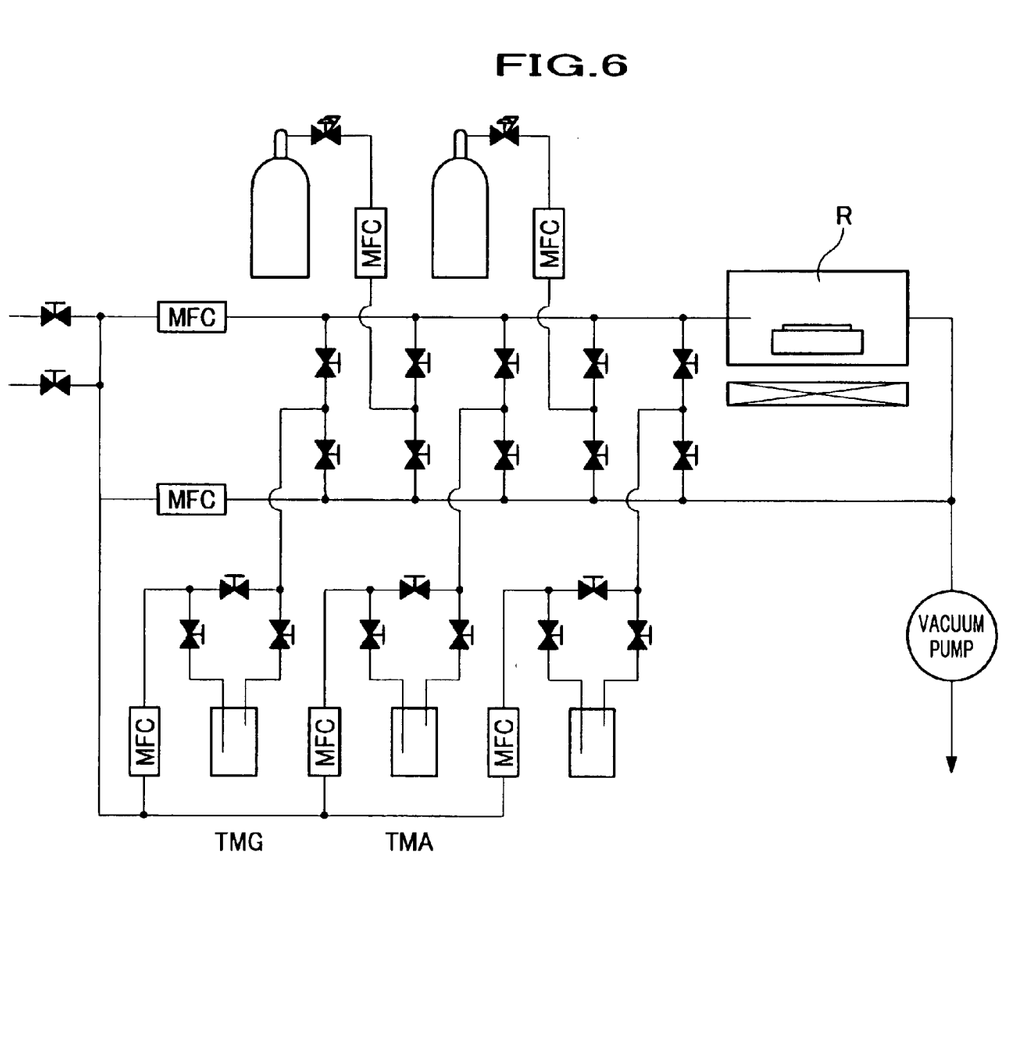
FIG. 6 is a plan view schematically illustrating one example of a gas-supply system when adapting the film-forming device to MOCVD.

With such a constitution, since the aforementioned thin-film forming device with a substrate rotating mechanism is used for Metal Organic chemical Vapor Deposition (MOCVD), various thin-films formed by MOCDV, such as compound semiconductors, are made with a desired film property and desired film thickness and in a more uniform manner, and the productivity of the thin-film can be improved (see FIGS. 4 and 6).

BRIEF DESCRIPTION OF THE DRAWINGS

Preferred embodiments of the present invention will be described below, by way of example only, with reference to the accompanying drawings, in which.

DESCRIPTION OF THE PREFERRED EMBODIMENT

With reference to the attached drawings, a preferred embodiment of the present invention will be described. Although the present invention will be described with reference to a specific embodiment, it is to be understood that the invention is not limited to this specific embodiment and various changes and modifications can be made without departing from the spirit and the scope of the invention.

Basic Construction of Film-forming Device D with a Substrate Rotating Mechanism

As shown in FIG. 4, a film-forming device D with a substrate rotating mechanism according to the present invention includes a reacting chamber R for applying a certain film-forming process to substrates W. The film-forming device D further comprises a rotation/revolution mechanism A and a temperature control mechanism TC in the reacting chamber R. The rotation/revolution mechanism A for the substrates W rotates the substrates W retained on substrate trays 20 by a stationary gear (rotation generating section) 4 and revolves a susceptor 30 which retains the substrate trays 20 by a driving gear (revolution generating section) 5 to revolve the substrates W. The temperature control mechanism TC includes a plurality of temperature control devices TA for controlling the temperatures of the substrates W and other necessary parts. In this preferred embodiment, a mechanism for transferring the substrates W, a mechanism for introducing materials required for a certain film-forming process applied to the substrates W, a mechanism for controlling the internal pressure of the reacting chamber R to a certain pressure and other mechanisms are omitted.

Rotation/revolution Mechanism A for Substrates W

As shown in FIG. 1., the rotation/revolution mechanism A for the substrates W comprises annular substrate trays 20 each retaining a substrate (not shown), a susceptor 30 in the form of a circular disk and rotatable retaining the substrate trays 20 via bearings (not shown), a base plate 6 rotatable retaining the susceptor 30 via a bearing (not shown), a stationary gear (rotation generating section) 4 meshing with gear teeth provided at the outer periphery of each substrate tray 20, a driving gear (revolution generating section) 5 meshing with gear teeth provided at the outer periphery of the susceptor 30, and a heat-soaking plate TP covered on the reverse side (upper side) of each substrate that is placed on a substrate retaining section 25 through a substrate insertion hole 24 with a film-formation plane (front side) facing downward.

The rotation/revolution mechanism A (not shown) rotates and revolves the substrates W (not shown) with the use of a first rotating mechanism 1 (revolution mechanism for the substrates), in which the susceptor 30 is rotated via the bearing around the rotation axis C1 by the driving gear 5, and a second rotating mechanism 2 (rotation mechanism for the substrates), in which the gear teeth of each substrate trays 20 and the gear teeth of the stationary gear 4 are meshed and the substrate trays 20 are rotated via the bearing by the rotation of the susceptor 30.

<First Rotating Mechanism 1>

FIG. 2 is a schematic sectional view explaining one example of the first rotating mechanism (revolution mechanism for the substrates) and the second rotating mechanism (rotating mechanism for the substrates) included in the film-forming device with a substrate rotating mechanism. As shown in FIG. 2, the first rotating mechanism 1 comprises a driving gear (revolution generating section) 5 rotating the susceptor 30 at the outer periphery and having driving gear teeth (rotation output section) 51, and the driving gear teeth 51 mesh with susceptor gear teeth (revolution input section) 31 provided at the outer periphery of the susceptor 30 so that when the driving gear 5 is driven, the susceptor 30 is rotated via the bearing B1 positioned between the susceptor 30 and the base plate 6.

The driving mechanism (not shown) for driving the driving gear 5 may be any known type normally used in the art, and as an example of the driving mechanism which performs a relatively stable operation, a magnetic shielded servo motor or stepping motor may be employed. A plurality of driving gears may be arranged when required. In the case of arranging a plurality of driving gears 5, in order to perform more stable operations, it is preferable that each driving gear 5 is furnished with an independent driving mechanism or each driving gear 5 is furnished with a torque imparting mechanism for independently applying a torque.

The gear mechanism consisting of the driving gear 5 and the susceptor 30 is not limited to a specific type, and as long as performing a stable operation, any known mechanism may be employed. For example, the driving gear teeth 51 and the susceptor gear teeth 31 may be spur gears or a gear pair with intersecting axes where the two rotation axes intersect each other. Alternatively, it is possible to form a worm wheel at the outer periphery of the susceptor 30 and the driving gear 5 is a worm gear.

<Susceptor Rotating Mechanism 36>

A susceptor rotating mechanism 36 (see FIG. 3) composed of the first rotating mechanism 1 and rotatable retaining the susceptor 30 with respect to the base plate 6 is not limited to a specific type. As long as performing a smooth and stable rotation of the susceptor 30, any known mechanism may be employed. However, in order to achieve the desired performance with a relatively simple structure, the bearing B1 is preferable.

Figure 3:
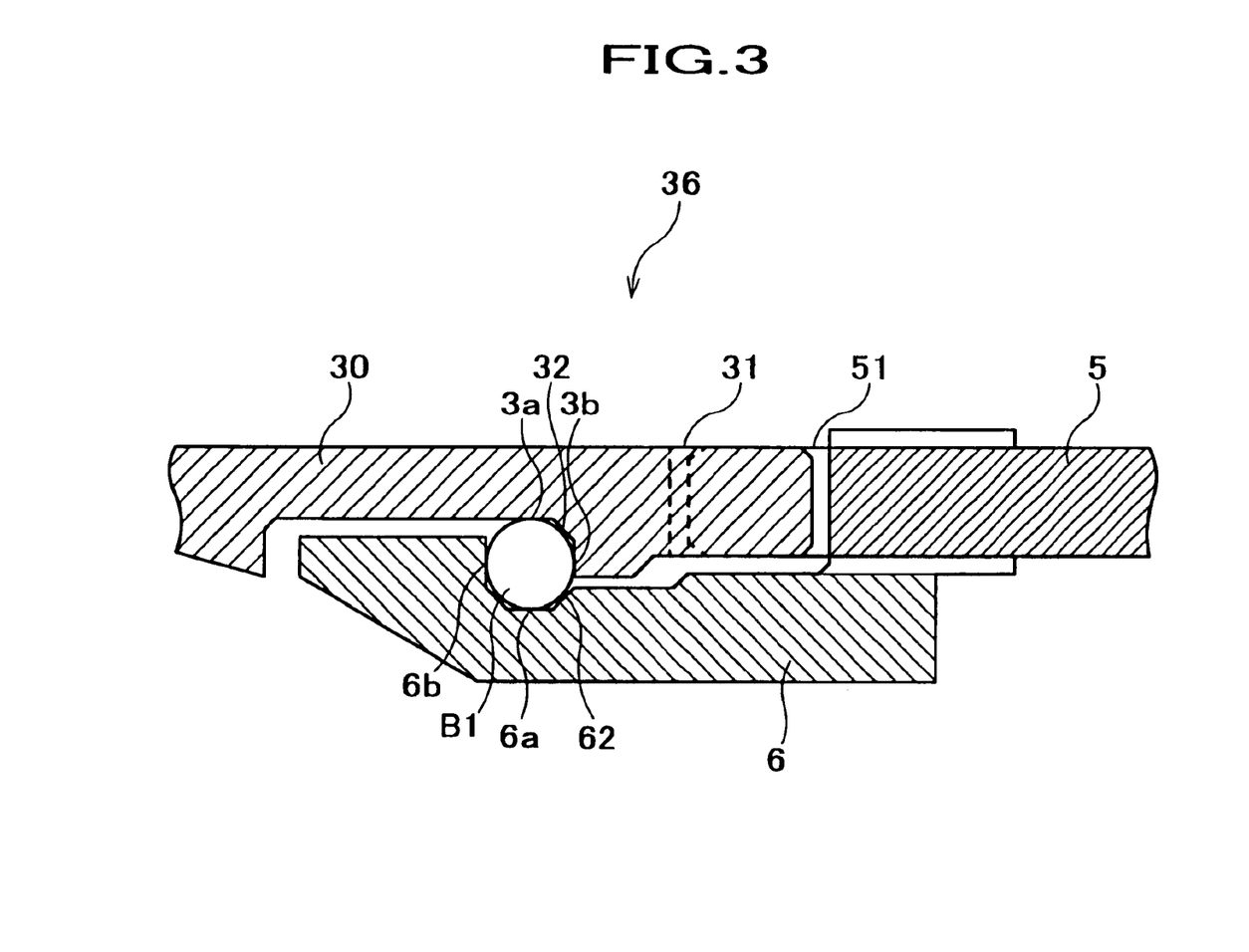
FIG. 3 is a sectional view schematically illustrating a bearing supported in bearing grooves formed on a susceptor and a base plate of the rotation/revolution mechanism.

FIG. 3 is a sectional view schematically illustrating the susceptor rotating mechanism 36, in which the bearing B1 is positioned between the susceptor 3 and the base plate 6 and the driving gear teeth (rotation output section) 51 of the driving gear 5 mesh with the susceptor gear teeth (revolution input section) 31 of the susceptor 30, and particularly, the bearing grooves 32. 62 for supporting the bearing B1 are illustrated.

As seen in FIG. 3, in the bearing grooves 32, 62, the bearing groove 32 of the susceptor 30 supports the bearing B1 at two points, viz, at an upper support portion 3a and an outer support portion 3b, and the bearing groove 62 of the base plate 6 supports the bearing B1 at least at two points, viz. at a lower support portion 6a and an inner support portion 6b.

Further, the upper support portion 3a and the lower support portion 6a position at the uppermost position and the lowermost position of the bearing B1, and the outer support portion 3b and the inner support portion 6b position at both ends of the bearing B1 in the horizontal direction. Since the bearing B1 is supported by the susceptor 30 at the upper support portion 3a and the outer support portion 3b and by the base plate 6 at least at the lower support portion 6a and the inner support portion 6b, the bearing B1 is supported in a more stable and reliable manner.

In other words, as shown in FIG. 3, the bearing grooves 32, 62 forms a run off to relieve the extension or expansion of the susceptor 30 and the base plate 6 in the lateral direction when the non shown temperature control mechanism heats the susceptor 30, the base plate 6 and the bearing B1 between the susceptor 30 and the base plate 6.

If the susceptor 30 and the base plate 6 are made to have substantially the same coefficient of thermal expansion, even when the thermal expansion occurs, the susceptor 30 relatively and outwardly expands toward the outer periphery with respect to the base plate 6 because the temperature of the susceptor 30 becomes higher than that of the base plate 6. Even in this event, since the susceptor 30 is horizontally supported by the plane including the upper support portion 3a (see FIG. 3), the relative position between the susceptor 30 and the base plate 6 does not change and therefore the susceptor 30 can be retained horizontally. When the temperature of the susceptor 30 is likely to decrease extremely below the temperature of the base plate 6, a clearance or gap may preferably be made on the outer support portion 3b or the inner support portion 6b.

It should be noted that the susceptor rotating mechanism and therefore the revolution mechanism 1 are accurately and precisely retained to perform a stable and smooth rotation because the susceptor 30 is horizontally retained, notwithstanding that the relative position is moved between the vertical support members (the outer support portion 3b and the inner support portion 6b) and the horizontal support members (the upper support portion 3a and the lower support portion 6a) due to the extension of the susceptor 30 and the base plate 6 derived from the thermal expansion by the temperature control mechanism (not shown). In addition to the above, the service life of each constitutional parts consisted of the first rotating mechanism (see FIGS. 1 and 2) becomes extended.

The susceptor rotating mechanism shown in FIG. 3 is constituted such that both the upper support portion 3a and the outer support portion 3b of the bearing groove 32 form a bearing supporting member of the susceptor 30 and both the lower support portion 6a and the inner support portion 6b of the bearing groove 62 form a bearing supporting member of the base plate 6. However, the susceptor rotating mechanism is not limited to this particular constitution.

Further, as long as performing a stable rotation, the gear mechanism formed by the driving gear 5 and the susceptor 30 is not limited to a particular type. For example, the driving gear teeth 51 and the susceptor gear teeth 31 may be spur gears or a gear pair with intersecting axes where the two rotation axes intersect each other. Alternatively, it is possible to form a worm wheel at the outer periphery of the susceptor 30 and the driving gear 5 is a worm gear.

<Second Rotating Mechanism 2>

As shown in FIGS. 1 and 2, the second rotating mechanism included in the film-forming device with a substrate rotating mechanism will be described. As seen in FIG. 1, the second rotating mechanism comprises a plurality of annular substrate trays 20 each retaining a substrate (not shown), tray gear teeth (rotation input section) 21 provided at the periphery of each substrate tray 20, a stationary gear (rotation generating section) 4, gear teeth 41 (rotating force generating section) of the stationary gear 4, the susceptor 30 rotatably retaining the substrate trays 20, a bearing B2 positioned between each substrate tray 20 and the susceptor 30, and bearing grooves 23, 33 provided on each substrate tray 20 and the susceptor 30, respectively. And when the tray gear teeth 21 and the stationary gear teeth 41 are meshed each other and the susceptor 30 is rotated around the rotation axis C1 by the driving gear 5, each substrate tray 20 rotates around the rotation axis C2 via the bearing B2.

Further, as long as performing a stable and reliable rotation. the gear mechanism including the stationary gear 4 and the tray gear teeth 21 of the substrate tray 20 is riot limited to a particular type. In order to simplify assembly and adjustment of the device with a simple structure, the stationary gear teeth 41 and the tray gear teeth 21 may be formed by spur gears. The expected performance can be obtained by such a gear mechanism employing spur gears Further, as long as performing a smooth rotation of the substrate tray 20, the constitution of the bearing groove 23 of the substrate tray 20 and the bearing groove 33 of the susceptor 30 as illustrated in FIG. 2 is not limited to a particular constitution. The bearing grooves 23, 33 may be similar to the bearing grooves 32, 62 for supporting the bearing B1, which positions between the susceptor 30 and the base plate 6. Of course, the bearing grooves 23, 33 may be formed by other means.

The substrate tray 20 is provided with a substrate support 25, which ensures a smooth insertion and a stable support of the substrate W. A claw-shaped support member is formed on the substrate support 25 to stably support the substrate W. The substrate W is retained on the substrate support 25 with a film-formation plane of the substrate W facing downward. Since a certain film-forming process is applied to the substrate W while the film-formation plane of the substrate facing downward, a deposit or adhesion of a foreign object on the film-formation plane from the above can be prevented.

<Stationary Gear 4 as a Rotation Generating Section for the Substrates 20>

The stationary gear (rotation generating section) 4 includes gear teeth (rotating force generating section) 41, and the stationary gear teeth 41 and the tray gear teeth (rotating force input section) 21 mesh each other. The stationary gear 4 is fixed to a stationary gear-fixing portion (not shown) independently of the susceptor 30. As described later, when the susceptor 30 rotates, each substrate tray 20 revolves around the rotation axis C1 of the susceptor 30 and the substrate tray 20 rotates with the meshing point between the stationary gear teeth 41 and the tray gear teeth 21 act as a point of application such that the substrate tray 20 and hence the substrate W on the substrate tray 20 carry out both rotation and revolution.

<Driving Gear 5 as a Revolution Generating Section for the Susceptor 30>

The driving gear (revolution generating section) 5 includes gear teeth 51, and the driving gear teeth 51 and the susceptor gear teeth (revolving force input section) 31 mesh each other such that the susceptor 30 is rotated in a certain direction when the driving gear 5 is rotated by a driving mechanism (not shown). The base plate 6 rotatably retains the susceptor 30 via the bearing B1. The base plate 6 is stationarily fixed to a base plate-fixing portion (not shown). For the purpose of ensuring a more stable rotation and/or a certain rotational speed of the susceptor 30, a plurality of driving gears 5 may be employed.

Although the explanation has been made to the driving gear teeth 51 as spur gears provided at the outer periphery of the susceptor 30, the driving gear teeth 51 is not limited to this specific embodiment. As long as desired effects are achieved, changes are made on the driving gear teeth 51. For example, the susceptor gear teeth 31 and the driving gear teeth 51 may be a gear pair with intersecting axes. Alternatively, it is possible to form a worm wheel at the outer periphery of the susceptor 30 and the driving gear 5 is formed by a worm gear.

As mentioned above, in the rotation/revolution mechanism A for the substrates W. when the driving gear 5 is rotated in a certain direction by the driving mechanism (not shown), a rotating force is transmitted from the driving gear teeth 51 to the susceptor gear teeth 31 so that the revolution mechanism 1, which is rotatably retained with respect to the base plate 6, rotates in the reverse direction against the rotation of the driving gear 5. The rotation mechanism 2 rotatably retained in the susceptor 30 then rotates in synchronization and in the reverse direction of the rotation of the revolution mechanism 1 with the meshing point of the stationary gear teeth 41 act as a point of application.

Accordingly, with respect to the substrate W retained on the substrate support 25 of the corresponding substrate tray 20, the rotation/revolution mechanism A simultaneously performs a revolution of the susceptor 30 around the rotation axis C1 and a rotation of the substrate tray 20 around the rotation axis C1 in synchronization of the revolution of the susceptor 30.

In this rotation/revolution mechanism A, the number of the rotation mechanisms 2 and the arrangement thereof are not limited to a specific pattern.

According to the rotation/revolution mechanism A used for the film-forming device, both of the susceptor 30 and the substrate tray 20 does not include a shaft member constituting a rotation axis C1, C2, and the susceptor 20 and the substrate trays 20 are rotated by the driving gear 5 or the stationary gear 4. For this reason, in comparison with the prior art film-forming device having a rotation shaft provided at the rotation axes C1, C2, the rotation/revolution mechanism A according to the present invention reduces the maintenance operations and performs relatively precise revolutions of the susceptor 30 and the substrate tray 20 and further ensures a more simple adjustment of the rotation axes C1, C2. Further, as described later, since the rotation/revolution mechanism A has a constitution without the rotation shaft, a wide range of variations of the susceptor 30 is possible and therefore a desired temperature profile is readily made.

Further, it is possible to prevent a deposition or adhesion of a foreign object on the film-formation plane, to which a certain film-forming process is applied, since the substrate W is retained in the substrate tray 20 with the film-formation plane facing downward.

Further, since the heat-soaking plates TP made from a material with an excellent heat-absorbing property are arranged on or adjacent to the substrates W, radiant heat radiated from the temperature control mechanism TC is effectively absorbed at the heat-soaking plates TP and the absorbed heat is effectively transferred to the substrates W. As a result, heat-absorption of the substrates W is promoted and a film-forming process applied to the substrates W is further promoted. Especially, even if the substrate W is made from a material, which hardly absorbs (or permeates) radiant heat (mainly far infrared radiation), such as Si and the like, a film-forming process such as MOCVD can be applied on the substrate W quite effectively. When doing so, in order to position the substrate W and the heat-soaking plate TP in a certain position of the corresponding substrate tray 20, it is preferable to form the substrate tray 20 as an annular plate having a stepped portion along its inner periphery.

With such a constitution of the rotation/revolution mechanism A, the substrates W are rotated and revolved more successively and more stably for a long period of time, thereby effectively preventing a dispersion of film thickness and film property in the plane where a thin-film is formed on the substrate W or between the substrates W.

<Temperature Control mechanism TC>

The temperature control mechanism TC adjusts the temperature of a desired area including the plurality of substrates W to a certain temperature distribution. The temperature control device TA constituting the temperature control mechanism TC is not limited to a particular device, and any known device can be employed as long as a certain temperature and a certain temperature profile are obtained to perform a thin-film growth with a desired uniformity. For example, when a film-forming process is applied on the substrates W by the MOCVD thin-film growth, a temperature control mechanism TA furnished with a temperature control device TA capable of heating to 800–900° C. is satisfactory.

Of these temperature control devices TA, a high-frequency heating device utilizing RF (Radio Frequency) and the like, an infrared ray lamp or a resistance heating mechanism is particularly suitable for CVD or MOCVD. If a temperature difference is relatively large between the low temperature area and the high temperature area of a desired temperature profile formed in the reaction system to which a film-forming process is applied, a water cooling-type or air cooling-type cooling system may be provided. Also, it is possible to carry out spot heating and/or spot cooling over a desired area by arranging these heating and/or cooling mechanisms.

According to the temperature control mechanism TC, since a plurality of temperature control devices TA are provided, a desired area of the substrates W is effectively heated and a film-forming process can be promoted.

As best seen in FIG. 4, the raw gas is introduced to the reacting chamber R from a lower center of the susceptor 30. The susceptor 30 is provided with an opening S at a center portion, and a cap member CA, which is made from the material selected from the group consisting of C, $SiO_2$, Mo, W, SiC, Si and GaAs, covers the opening S. Because of the cap member CA, heat transfer from the temperature control mechanism TC is suitably decreased at the boundary of the cap member CA and the susceptor 30. As an example of the temperature control device A included in the temperature control mechanism TC, a resistance heating device is arranged coaxially with and above the susceptor 30. However, the present invention is not limited to this specific embodiment, and changes can be made when necessary.

If the temperature control mechanism TC is not arranged above the cap member CA and is arranged above the susceptor 30 off from the cap member CA, the temperature of the cap member CA and hence the opening S become lower than the other area of the susceptor 30. Therefore, the temperature below the opening S becomes lower than that of the other area below the susceptor 30. As a result, because thermal decomposition of the raw gas is suitably restricted, it is possible to prevent an occurrence of a deposit resulting from an excessive decomposition of the raw gas at the upstream of the wafer.

As best seen in FIG. 5, a prior art film-forming device D' with a substrate rotating mechanism, a rotation shaft SC is provided at a center of the susceptor 300, which retains substrate trays 200 each holding a substrate W. The susceptor 300 is rotated when the rotation shaft SC is rotated by a driving mechanism (not shown). In the prior art device D', the shape of the susceptor 300 is restricted because of the provision of the rotating shaft SC. As a result, it is difficult to make the internal temperature of the reacting chamber R to a desired temperature profile.

<Material of the Substrate Tray 20>

The material of the substrate tray 20 is not limited. As long as obtaining a desired temperature profile and not inhibiting the quality of the substrates W (e.g. the amount of discharged gas is sufficiently low), any know material may be used. However, in terms of providing a sufficient heat resistance against the heat from the temperature control mechanism, a material having excellent heat resistance is preferable, such as graphite carbon or glassy carbon.

<Material of Bearings B1 and B2>

The material of the bearings B1, B2 is not limited. As long as a stable and smooth rotation of the rotation/revolution mechanism A is obtained, any known bearing can be used. In terms of a sufficient heat resistance at relatively high temperatures, a relatively low coefficient of thermal expansion and a material not inhibiting the quality of the substrate W (e.g. the amount of discharged gas is sufficiently low), graphite carbon or glassy carbon is preferable.

<Material of the Susceptor 30>

As long as having a sufficient heat resistance with respect to heat from the temperature control mechanism TC and a relatively low coefficient of thermal expansion and made from a material not inhibiting the quality of the substrate W (e.g. the amount of discharged gas is sufficiently low), the susceptor 30 may be made from any known material. Further, in order to obtain a desired temperature profile, a center of the susceptor 30 is removed in a circular disk shape having a certain diameter so that the opening S is formed at the center of the susceptor 30. The opening S is preferably covered by the cap member CA, which is made from the material selected from the group consisting of carbon (C), quartz ($SiO_2$), molybdenum (Mo), tungsten (W), silicon carbide (SiC), silicon (Si) and gallium arsenide (GaAs). Covering the opening S by the cap member CA made from the above materials makes the heat transmission between the susceptor 30 and the cap member CA appropriately lower. As a result, the temperature of the cap member CA becomes appropriately lower in comparison with the temperature of the susceptor 30.

In other words, the susceptor 30 is heated by the heat radiated from the temperature control mechanism TC. In the heated susceptor 30, the heat transmission in the lateral (or horizontal) direction is dominant, and the temperature profile of the susceptor 30 is substantially uniform in the lateral (or horizontal) direction. For this reason, the profile of the radiant heat from the susceptor 30 is also substantially uniform. Meanwhile. as to the temperature profile within the reacting chamber R where the susceptor 30 is positioned, influence of radiant heat from the temperature control mechanism TC and the susceptor 30 is dominant. However, in terms of position and volume, the susceptor 30 is more contributive. Therefore, according to the present invention, a certain cap member CA is fitted into the opening S of the susceptor 30 so that the heat transmission in the lateral (or horizontal) direction of the susceptor 30 can be controlled and the temperature of the opening S becomes lower than the other area of the susceptor 30.

As mentioned above, since the temperature of the opening S becomes lower than the other area of the susceptor 30, the temperature profile within the reacting chamber R is made and the temperature becomes lower at the lower region below the opening S. As a result, in the reacting chamber of the MOCVD apparatus such as shown in FIG. 1, if a layout is such that the raw gas is introduced from below the susceptor 30, the temperature of the inlet portion from which the raw gas is introduced can be decreased. As a result, decomposing reaction of the raw gas is restricted at the inlet portion of the raw gas, and the raw gas is consumed more effectively for thin-film growth of the substrates W.

Further, when the film-forming device as shown in FIG. 4 is utilized for the MOCVD apparatus, if a layout is adapted in the reacting chamber R such that the raw gas is introduced from below the susceptor 30, the temperature becomes lower at the inlet portion of the raw gas so as to restrict the decomposing reaction of the raw gas. As a result, a production of a deposit derived from the decomposing reaction can be restricted, and therefore an occurrence of particles derived from peeling of the deposit can be restricted.

As mentioned above, the film-forming device with a substrate rotating mechanism according to the present invention is particularly suitable for a thin-film formation by CVD including MOCVD and the like. For example, the film-forming device according to the present invention can be applied in the reacting chamber R of the MOCVD apparatus as illustrated in FIG. 4.

FIG. 6 is a plan view schematically illustrating one example of a gas-supply system when applying the film-forming device to MOCVD. As shown in FIG. 6, $H_2$ (Hydrogen) and $N_2$ (Nitrogen) are used as a carrier gas. And for example, $A_sH_3$ (Arsin) for a group V material, $S_1H_4$ (Mono-silane) or $S_{12}H_6$ (Disilane) as a doping gas, Tri-Methyl-Gallium or Tri-Methyl-Aluminum for a group III metal organic material are introduced into the reacting chamber R of the film-forming device to form an epitaxial film of AlGaAs compound semiconductor.

Meanwhile, when the film-forming device with a substrate rotating mechanism according to the present invention is applied to MOCVD, if a semiconductor thin-film is formed by epitaxial growth while making a desired temperature profile, it is possible to decrease a defective density within the semiconductor thin-film by appropriately controlling the epitaxial growth speed as well as to control the carrier density suitably.

Moreover, because it is possible to restrict an occurrence of a reaction product due to the reaction of the raw gas at an area other than the film-formation plane, a deposit on the wall of the reacting chamber can be decreased, and as the result of extended temperature region required for a thin-film formation, the number of substrates to form a thin-film thereon or the area of the substrates can be increased. Accordingly, since the area of a desired thin-film formed by a certain amount of raw gas can be increased, the efficiency of raw gas utilization with regard to the thin-film growth can be improved.

The thin-film forming device with a substrate rotating mechanism according to the present invention is particularly suitable for a film-forming process utilizing vapor phase growth such as MOCVD. However, the present invention is not limited to this specific use. For example, the present invention can be applied for plasma CVD as a film-forming process utilizing plasma, other film-forming process such as sputtering, or processing such as dry etching wherein an etching process is carried out on the substrate surface within a gaseous phase.

What is claimed is:

1. A film-forming device with a substrate rotating mechanism, which comprises:
    a susceptor in the form of a circular disk and provided at an outer periphery thereof with a revolution input section;
    a base plate positioned below the susceptor and rotatably retaining the susceptor via a bearing supported between bearing grooves each provided at the susceptor and the base plate;
    a first rotating mechanism including at least one revolution generating section, the revolution generating section rotating the susceptor at the outer periphery of the susceptor by way of generating a rotating force at the revolution input section wherein the revolution generating section and susceptor are coplanar;
    a plurality of substrate tray retaining sections positioned circumferentially around a rotation axis of the susceptor;
    a plurality of annular substrate trays provided at an outer periphery thereof with a rotation input section and rotatably supported in the corresponding substrate tray retaining sections for supporting a plurality of substrates;
    a second rotating mechanism including a rotation generating section, the rotation generating section rotating the substrate trays by way of generating a rotating force at each rotation input section,
    a plurality of the substrates being supported in the corresponding substrate trays, the substrates being revolved by the rotation of the susceptor and rotated by the rotation of the substrate trays to apply a certain film-forming process;
    a reacting chamber extending across the rotation axis of the susceptor an surrounding the substrate tray retaining sections; and
    a temperature control mechanism positioned in the reacting chamber.

2. A film-forming device with a substrate rotating mechanism according to claim 1, wherein each of the substrate trays rotates synchronously with the rotation of the susceptor.

3. A film-forming device with a substrate rotating mechanism according to claim 2, wherein the revolution input section and the rotation input section are formed by gears, and wherein the rotation generating section is a ring-shaped stationary gear, the inner periphery of which is provided with gears meshing with the rotation input section of each substrate tray.

4. A film-forming device with a substrate rotating mechanism according to claim 1, wherein said first rotating mechanism rotatably retains the susceptor via a bearing supported between bearing grooves, each provided at the susceptor and the base plate, and wherein said second rotating mechanism rotatably retains the substrate trays via a bearing supported between bearing grooves, each provided at the substrate trays and the susceptor.

5. A film-forming device with a substrate rotating mechanism according to claim 4, wherein in the first rotating mechanism, the bearing groove of said susceptor and the bearing groove of said base plate are each provided with a horizontal plane and a vertical plane, wherein the bearing groove of said susceptor supports the bearing at an upper support portion and an outer support portion, which position above the bearing and provided in said horizontal and vertical planes, and the bearing groove of the base plate supports the bearing at a lower support portion and an inner support portion, which position below the bearing and provided in said horizontal and vertical planes, and wherein said upper support portion and said lower support portion position at the uppermost position and the lowermost position of the bearing, and the outer support portion and the inner support portion position at both ends of the bearing in the horizontal direction.

6. A film-forming device with a substrate rotating mechanism according to claim 4, wherein the substrate trays, the susceptor and the bearings are made from graphite carbon.

7. A film-forming device with a substrate rotating mechanism according to claim 1, wherein each substrate tray retains the substrate on a substrate support with a film-formation plane of the substrate positioned downward.

8. A film-forming device with a substrate rotating mechanism according to claim 1, wherein said susceptor is provided at a center portion with an opening, and said opening is covered by a cap member, which is made from the material selected from the group consisting of carbon (C), quartz ($SiO_2$), molybdenum (Mo), tungsten (W), silicon carbide (SiC), silicon (Si) and gallium arsenide (GaAs).

9. A film-forming device with a substrate rotating mechanism according to claim 1, wherein said certain film-forming process is a thin-film growth by Metal Organic Chemical Vapor Deposition (MOCVD) method.

10. The film-forming device as claimed in claim 1, wherein the revolution generating section is positioned

17 outside the outer periphery of the susceptor in a radial direction of the susceptor.

11. A film-forming device with a substrate rotating mechanism, which comprises:

a susceptor in the form of a circular disk and provided at an outer periphery thereof with a revolution input section, the susceptor including no rotational shaft at the center thereof;

a base plate positioned below the susceptor and rotatably retaining the susceptor via a bearing supported between bearing grooves each provided at the susceptor and the base plate;

a first rotating mechanism including at least one revolution generating section, the revolution generating section rotating the susceptor at the outer periphery of the susceptor by way of generating a rotating force at the revolution input section wherein the revolution generating section and susceptor are coplanar;

a plurality of substrate tray retaining sections positioned circumferentially around a rotation axis of the susceptor;

a plurality of annular substrate trays provided at an outer periphery thereof with a rotation input section and rotatably supported in the corresponding substrate tray retaining sections for supporting a plurality of substrates;

a second rotating mechanism including a rotation generating section, the rotation generating section rotating the substrate trays by way of generating a rotating force at each rotation input section, a plurality of the substrates being supported in the corresponding substrate trays, the substrates being revolved by the rotation of the susceptor and rotated by the rotation of the substrate trays to apply a certain film-forming process;

a reacting chamber extending across the rotation axis; of the susceptor and surrounding the substrate tray retaining sections; and a temperature control mechanism positioned in the reacting chamber.

12. A film-forming device with a substrate rotating mechanism, which comprises:

a susceptor in the form of a circular disk and provided at an outer periphery thereof with a revolution input section;

a base plate positioned below the susceptor and rotatably retaining the susceptor via a bearing supported between bearing grooves each provided at the susceptor and the base plate to provide a non-rotational shaft structure at a center of the susceptor;

a first rotating mechanism including at least one revolution generating section, the revolution generating section rotating the susceptor at the outer periphery of the susceptor by way of generating a rotating force at the revolution input section wherein the revolution generating section and susceptor are coplanar;

a plurality of substrate trays retaining sections positioned circumferentially around a rotation axis of the susceptor;

a plurality of annular substrate trays provided at an outer periphery thereof with a rotation input section and rotatably supported in the corresponding substrate tray retaining sections for supporting a plurality of substrates;

a second rotating mechanism including a rotation generating section, the rotation generating section rotating the substrate trays by way of generating a rotating force at each rotation input section, a plurality of the substrates being supported in the corresponding substrate trays, the substrates being revolved by the rotation of the susceptor and rotated by the rotation of the substrate trays to apply a certain film-forming process;

a reacting chamber extending across the rotation axis of the susceptor and surrounding the substrate tray retaining sections; and a temperature control mechanism positioned in the :reacting chamber.

13. A film-forming device with a substrate rotating mechanism, which comprises:

a susceptor in the form of a circular disk and provided at an outer periphery thereof with a revolution input section;

a base plate positioned below the susceptor and rotatably retaining the susceptor via a bearing supported between bearing grooves each provided at the susceptor and the base plate;

a first rotating mechanism including at least one revolution generating section, the revolution generating section rotating the susceptor at the outer periphery of the susceptor by way of; generating a rotating force at the revolution input section wherein the revolution generating section and susceptor are coplanar;

a plurality of substrate trays retaining sections positioned circumferentially around a rotation axis of the susceptor;

a plurality of annular substrate trays provided at an outer periphery thereof with a rotation input section and rotatably supported in the corresponding substrate tray retaining sections for supporting a plurality of substrates;

a second rotating mechanism including a rotation generating section, the rotation generating section rotating the substrate trays by way of generating a rotating force at each rotation input section, a plurality of the substrates being supported in the corresponding substrate trays, the substrates being revolved by the rotation of the susceptor and rotated by the rotation of the substrate trays to apply a certain film-forming process;

a reacting chamber extending across the rotation axis of the susceptor and surrounding the substrate tray retaining sections, upper and lower planes on the susceptor within the outer periphery thereof being entirely exposed to the reacting chamber; and a temperature control mechanism positioned in the reacting chamber.

14. A film-forming device with a substrate rotating mechanism, which comprises:

a susceptor in the form of a circular disk and provided at an outer periphery thereof with a revolution input section;

a base plate positioned below the susceptor and rotatably retaining the susceptor via a bearing supported between annular bearing grooves each provided at the susceptor and the base avoid a shaft structure at a center of the susceptor, the groove provided at the base plate comprising a lower support portion and an inner support portion extending in parallel to an axis of the rotatably retained susceptor for supporting the bearing outwardly from the axis of the rotatably retained susceptor, the groove, provided at the susceptor, substantially consisting of an upper support portion and an outer support portion extending in parallel to the axis for supporting the bearing inwardly with respect to an axis of the rotatably retained susceptor to rotate the susceptor with stable support of the susceptor irrespective of temperature variation;

a first rotating mechanism including at least one revolution generating section, the revolution generating section rotating the susceptor at the outer periphery of the susceptor by way of generating a rotating force at the revolution input section Wherein the revolution generating section and susceptor are coplanar;

a plurality of substrate trays retaining sections positioned circumferentially around a rotation axis of the susceptor;

a plurality of annular substrate trays provided at an outer periphery thereof with a rotation input section and rotatably supported in the corresponding substrate tray retaining sections for supporting a plurality of substrates;

a second rotating mechanism including a rotation generating section, the rotation generating section rotating the substrate trays by way of generating a rotating force at each rotation input section, a plurality of the substrates being supported in the corresponding substrate trays, the substrates being revolved by the rotation of the susceptor and rotated by the rotation of the substrate tray's to apply a certain film-forming process;

a reacting chamber extending across the rotation axis of the susceptor an surrounding the substrate tray retaining sections, upper and lower planes on the susceptor within the outer periphery thereof being entirely exposed to the reacting chamber; and a temperature control means in the reacting chamber for actually controlling, by infrared radiation, a temperature distribution over one of upper and lower planes on the susceptor within the outer periphery thereof, wherein the other one of upper and lower planes at least at a center of the susceptor directly faces the temperature control element with respect to the heat radiation, wherein the other one of upper and lower planes within the outer periphery of the susceptor entirely, directly faces the temperature control element, wherein the revolution generating section is positioned outside the outer periphery of the susceptor in a radial direction of the susceptor, wherein the annular substrate tray, the rotation input section, and the second rotating mechanism are substantially coplanar, wherein the susceptor is provided at a center portion with an opening as a part of the non-rotational shaft structure, and the opening is selectively covered by a cap member to control the temperature distribution.

* * * * *